(12) United States Patent
van Hasselt

(10) Patent No.: US 7,509,815 B2
(45) Date of Patent: Mar. 31, 2009

(54) SUPERCONDUCTING DEVICE HAVING CRYOSYSTEM AND SUPERCONDUCTING SWITCH

(75) Inventor: Peter van Hasselt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 355 days.

(21) Appl. No.: 11/287,198

(22) Filed: Nov. 28, 2005

(65) Prior Publication Data

US 2006/0135370 A1    Jun. 22, 2006

(30) Foreign Application Priority Data

Nov. 26, 2004   (DE) .................. 10 2004 057 204

(51) Int. Cl.
  *F25B 19/00*   (2006.01)
  *F17C 3/10*    (2006.01)
  *H01F 6/06*    (2006.01)
  *H01F 1/00*    (2006.01)
  *H01L 39/00*   (2006.01)

(52) U.S. Cl. ................. 62/51.1; 62/48.2; 505/163; 335/216

(58) Field of Classification Search .......... 62/51.1, 62/48.2; 505/163, 211; 335/216
See application file for complete search history.

(56) References Cited

U.S. PATENT DOCUMENTS

| | | | |
|---|---|---|---|
| 3,255,335 A | 6/1966 | Kortelink | |
| 3,800,256 A * | 3/1974 | Garwin | ........................ 335/216 |
| 4,173,775 A * | 11/1979 | Kneip, Jr. | .................... 361/141 |
| 4,314,123 A | 2/1982 | Hieronymus | |
| 4,602,231 A | 7/1986 | Purcell et al. | |
| 4,904,970 A * | 2/1990 | Srivastava | .................... 335/216 |
| 5,680,085 A * | 10/1997 | Aihara et al. | ............... 335/216 |
| 5,739,997 A * | 4/1998 | Gross | .......................... 361/19 |
| 5,757,257 A | 5/1998 | Doi et al. | |
| 2002/0017970 A1 * | 2/2002 | Kinder | ....................... 335/299 |

FOREIGN PATENT DOCUMENTS

| | | |
|---|---|---|
| DE | 102 21 639 B4 | 11/2003 |
| EP | 0 074 030 A2 | 3/1983 |
| EP | 0 014 766 B1 | 5/1983 |
| EP | 0 645 830 A1 | 3/1995 |
| JP | 59-098572 | 6/1984 |
| JP | 02-105475 | 4/1990 |
| JP | 09-083023 | 3/1997 |
| WO | 03/098645 A1 | 11/2003 |

OTHER PUBLICATIONS

Great Britain Search Report for Application No. GB0523941.3 mailed Feb. 21, 2006.
Office Action in German Patent Application No. 10 2004 057.6-24; mailed Jul. 25, 2005.

* cited by examiner

*Primary Examiner*—William C Doerrler
(74) *Attorney, Agent, or Firm*—Staas & Halsey LLP

(57) ABSTRACT

A superconducting device has a cryosystem to whose cryogenic medium a superconducting appliance and a superconducting switching path (which is electrically connected to it and can be activated thermally by means of a heater) of a superconducting switch are thermally coupled. A pipeline, to whose end the superconducting switching path is thermally coupled, is connected to a coolant area of at least one superconducting appliance. To ensure reliable heating of the switching path when the heater is activated, the pipeline has a cross-sectional constriction which impedes the heat exchange with the coolant area.

17 Claims, 2 Drawing Sheets

SUPERCONDUCTING DEVICE HAVING CRYOSYSTEM AND SUPERCONDUCTING SWITCH

CROSS REFERENCE TO RELATED APPLICATIONS

This application is based on and hereby claims priority to German Patent Application No. 10 2004 057 204.6 filed on Nov. 26, 2004, the contents of which are hereby incorporated by reference.

BACKGROUND OF THE INVENTION

1. Field of the Invention

The invention relates to a superconducting device having a cryosystem with a cryogenic medium cooled by a refrigeration installation. The superconductors of at least one superconducting appliance and the superconducting switching path, which is electrically connected to these superconductors, of a superconducting switch are thermally coupled. The superconducting switching path has associated heating means for controlled changing of the superconducting material of the switching path to the normally conductive state.

2. Description of the Related Art

EP 0 074 030 A2 discloses a corresponding superconducting device having a cryosystem of the relevant type.

In the case of superconducting switches, the physical effect of the controllable change from the superconducting state to the normally conductive state can be used to provide a switching function, in particular in those situations in which there is no need for potential isolation directly with the actual switching process. Corresponding switches are used in particular in the field of magnetic resonance imaging (MRI) for medical diagnosis as so-called continuous current or short-circuiting switches for superconducting magnets. In order to allow current to be applied to the superconducting magnet windings of such appliances/magnets, the superconducting switching path of the short-circuiting switch which bridges them must be opened. In this case, the superconducting state can be overcome by increasing the temperature above the critical temperature, by increasing the electrical current density and/or by increasing the magnetic field on the switching path. Corresponding switching paths, which can be controlled thermally, in superconducting switches have been known for a long time (see EP 0 074 030 A2, U.S. Pat. Nos. 3,255,335 or 4,602,231).

The superconducting switch is normally located within a cryosystem having a cryogenic medium which is also used to cool the superconductors of a superconducting appliance, such as magnet winding (see the EP-A2 Document mentioned initially). This means that, when the switch is in the warm, normally conductive state, it introduces a considerable amount of heat into the cryogenic medium of the cryosystem. This amount of heat may be up to several watts in a liquid-helium (LHe) bath of an MRI magnet. In many cases, introduction of heat such as this is unacceptable. This relates in particular to recondensing, closed cryosystems, in which the refrigeration power is provided by a cold head of a refrigeration installation, for example in the form of a so-called cryo-cooler. Cryocoolers such as these are, in particular, of the Gifford McMahon or Stirling type, or are in the form of so called pulse-tube coolers.

SUMMARY OF THE INVENTION

One object of the present invention is to refine the superconducting device with the features mentioned initially in such a way as to ensure a reliable switching operation of the thermally activated switching path of the superconducting switch.

Accordingly, the aim is to connect a pipeline to a coolant area of the cryogenic medium in order to cool the superconductors of the at least one appliance, to the end of which pipeline the switching path of the superconducting switch is thermally coupled and which has a cross-sectional constriction in such a way that the dissipated losses which are caused on activation of the heating means are greater than the refrigeration power which can be transferred from the refrigeration installation through the cross-sectional constriction by the cryogenic medium which is located in the coolant area.

In the cryosystem of the superconducting device according to the invention, the thermal coupling of the superconducting switch thus takes place via that part of the cryogenic medium which cools the superconductors of the superconducting appliance via that part of the cryogenic medium which is located in the pipeline. On the one hand, this makes it possible to provide cooling with very good coupling and with little dissipated power in the switch, with this coupling being comparable to bath cooling; on the other hand, refrigeration power which can be transferred to the switch can be effectively limited by the choice of the cross section of the pipeline in the area of its constriction, by reducing the heat flow from the activated switching path, which is now resistive, into the coolant area that is connected to the pipeline. This makes it possible to keep the switch in the normally conductive state with relatively low dissipated losses U2/R (where U=the voltage that is dropped across the switching path that has become resistive, and R=its resistance), which may be considerably below the watts area of known thermally switching switches. Any excessive power loss which may occur in the switch then leads to continuous heating of the switching path in the activated/resistive state. This advantageously makes it possible to ensure a safe switching state and, in the process, to limit the required refrigeration power of the cryosystem and of its refrigeration installation.

Desired limiting of the heatflow into the cryogenic medium in the coolant area can in general be achieved with the cross-sectional constriction having a cross-sectional area between 0.5 mm$^2$ and 100 mm$^2$, preferably between 7 mm$^2$ and 30 mm$^2$. This on the one hand makes it possible to ensure sufficiently good cooling of the switching path without, on the other hand, too much heat entering the coolant line system.

The cross-sectional constriction should preferably be located in a part of the pipeline facing the superconducting switch, in order to prevent heat from being introduced into larger parts of the cryogenic medium.

The coolant area may advantageously be part of a coolant line system with coolant paths on or through the at least one superconducting appliance. This makes it possible to limit the required amount of cryogenic medium.

In this case, it is advantageously possible to provide for circulation of the cryogenic medium in the coolant line system on the basis of the so-called thermosyphon effect (see, for example, WO 03/098645 A1).

The refrigeration power can preferably be introduced into the cryogenic medium that is circulating in the coolant line system by at least one cold head of at least one refrigeration installation. Since the introduction of heat into the cryogenic medium is limited by the use according to the invention of the pipeline with a constriction, known refrigeration installations with a restricted refrigeration power can be used.

The at least one superconducting appliance and the superconducting switch may be arranged in a common vacuum area. Superconducting connecting conductors can then advantageously run through the vacuum area, between the switching path and the superconductors of the appliances, without particularly complex cooling measures.

The cryogenic medium can also advantageously circulate in the pipeline on the basis of the thermosyphon effect.

In general, the cryogenic medium is helium. This medium is required in particular when the superconducting parts of the superconducting device have so-called low-$T_c$ superconductor material (LTC superconductor material) as the superconducting material. Different cryogenic media can be used, of course, when using oxidic high-$T_c$ superconductor material (HTC superconductor material).

The superconducting switch may, in a manner known per se, be in the form of a continuous-current switch or short-circuiting switch. Corresponding switches are particularly suitable for continuous operation of superconducting magnet windings, which do not require any permanent external electrical power supply.

Corresponding magnet windings may preferably be those for an MRI magnet.

BRIEF DESCRIPTION OF THE DRAWINGS

These and other objects and advantages of the present invention will become more apparent and more readily appreciated from the following description of an exemplary embodiment, taken in conjunction with the accompanying drawings of which.

DETAILED DESCRIPTION OF THE PREFERRED EMBODIMENT

Figure 1:
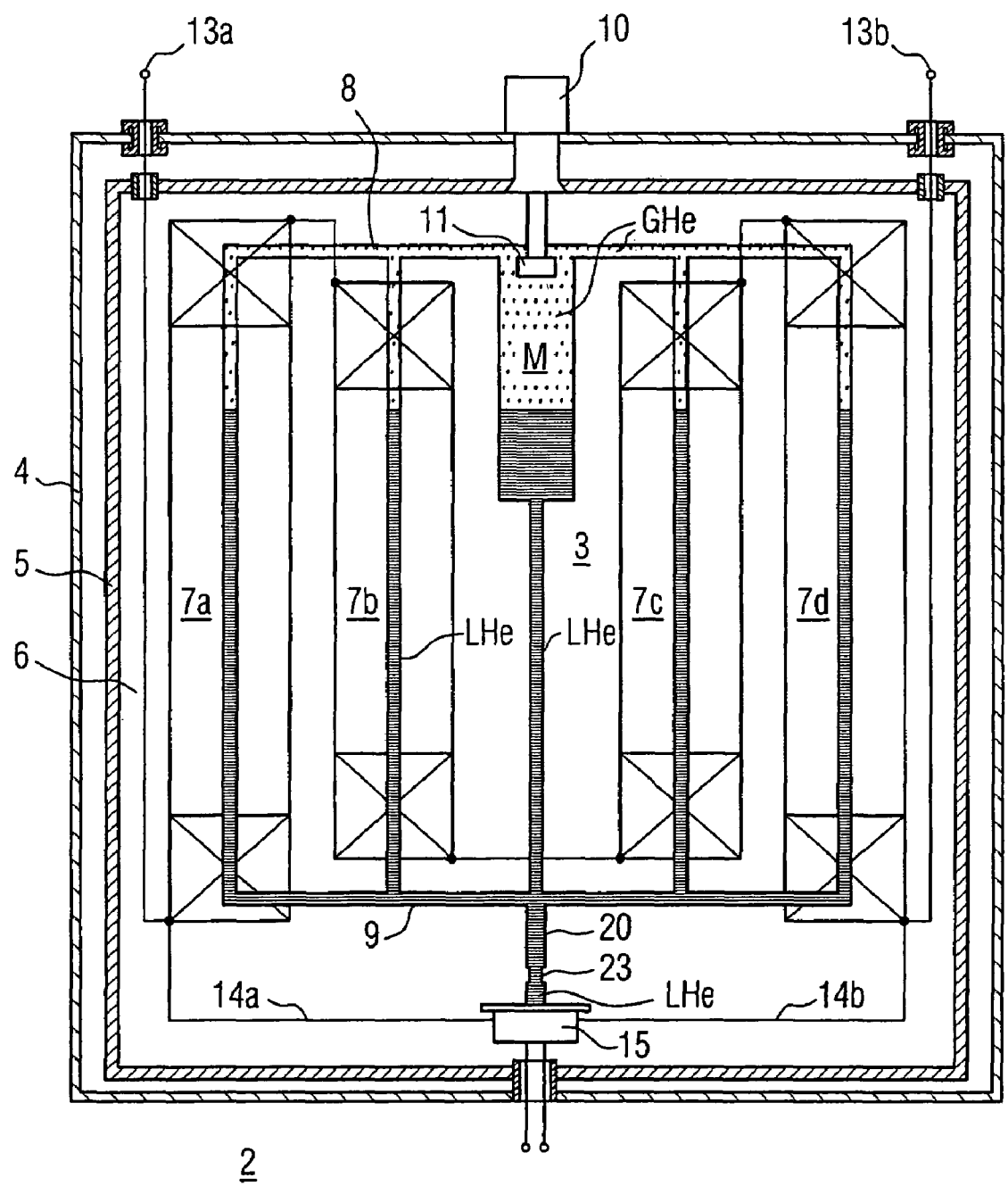
FIG. 1 shows a highly schematic view of a longitudinal section through a superconducting device having a cryosystem designed according to the invention.

Reference will now be made in detail to the preferred embodiments of the present invention, examples of which are illustrated in the accompanying drawings, wherein like reference numerals refer to like elements throughout.

The cryosystem designed according to the invention may be provided per se for any desired superconducting devices which require at least one superconducting switch for their at least one superconducting appliance. Superconducting appliances or apparatuses may, for example, be a magnet, a machine or a transformer; alternatively, it may be a superconducting cable. The superconducting appliance is preferably an MRI magnet or a corresponding magnet system, which can be short-circuited by at least one superconducting continuous-current switch for the operating state. The following text is based on the assumption of an exemplary embodiment such as this.

The superconducting device which is annotated generally by 2 in FIG. 1 has a cryosystem 3 with a cryostate 4. A radiation shield 5 is provided and a vacuum area 6 is formed in its interior, for thermal isolation. Four superconducting magnets 7a to 7d of an MRI magnet system are accommodated in this vacuum area as superconducting appliances. A coolant line system 8 is provided in order to cool the superconductors of these magnets with a cryogenic medium M such as helium, and the coolant paths of this system 8 run to the or through the magnets. The line system 8 has a coolant area 9, in which the cryogenic medium is collected on the lower face of the magnets 7a to 7d, after passing through them. The cryogenic medium M can preferably flow in the coolant line system 8 on the basis of the thermosyphon effect, that is to say there is no need for known bath cooling. For this purpose, cryogenic medium M in the coolant line system 8 is thermally coupled on its upper face to the cold head 11 of a refrigeration installation 10, where gaseous helium GHe is (re)condensed to form liquid helium LHe. The line system 8 can possibly also be in the form of a single-pipe system in a manner known per se (see the cited WO 03/098645 A1). In a line system such as this, both the flow of the cooler medium in the direction of the coolant area 9 and thus to the switching path 16 to be cooled and the reverse flow of the heated medium to the cold head 11 take place in the same line.

The ends of the magnets 7a to 7d, which are electrically connected in series, can be connected via electrical connecting conductors 13a and 13b to an electrical power source which is located outside the cryostate. A thermal continuous-current or short-circuiting switch 15, which is known per se, is connected between these connecting conductors of the electrical power source within the vacuum area 6, and the series circuit formed by the superconducting magnets 7a to 7d can be short-circuited to this. For this purpose, the switch 15 has a superconducting switching path 16 which, when required, can be changed from the superconducting state to the normally conductive state by an electrical heating element 17, which can be driven externally. By way of example, the switching path then has a resistance R from 20 to 30 Ω, with a voltage drop U of about 10 V.

In order to cool this switching path 16, the switch 15 is not integrated directly in the coolant line system 8 with the cryogenic medium M. In fact, a special pipeline 20 is connected to the lower coolant area 9 of the line system 8, via which the cryogenic medium M can be passed to the switch 15. A heat bus in the form, for example, of a plate 21 composed of a thermally highly conductive material such as copper is used for thermal coupling of the switch 15 to the lower, terminated end of this pipeline 20. This plate is electrically insulating, but is connected in a sufficiently highly thermally insulating manner to the interior of the switch 15, and thus to the switching path 16. By way of example, an adhesive bond 22 by a suitable epoxy resin adhesive such as that of the trade name "Stycast" (Emerson and Cuming Company, US) can be provided for this purpose, and this adhesive must also be sufficiently compatible with low temperatures.

Figure 2:
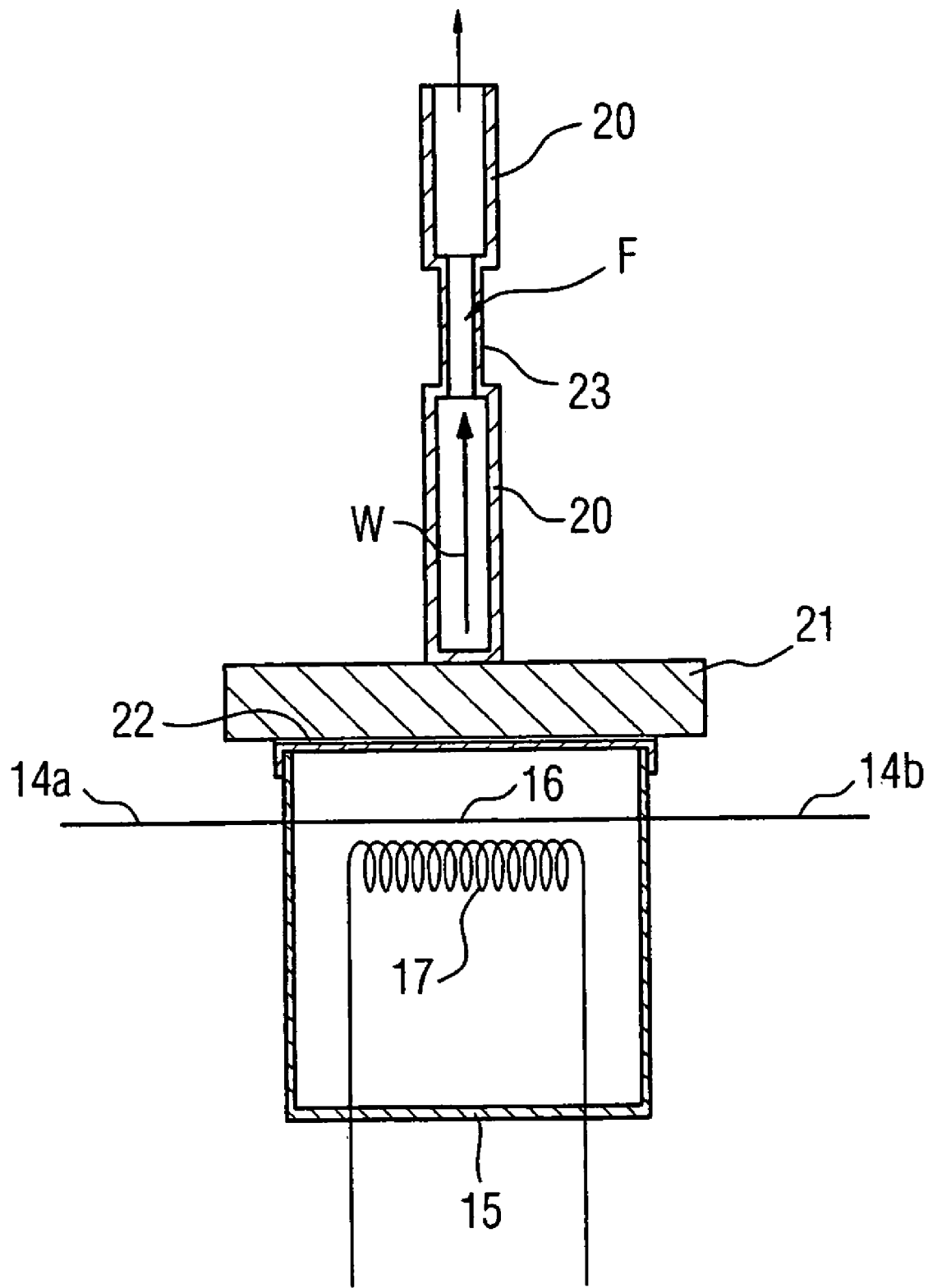
FIG. 2 shows a detailed view of the super conducting switch for the device shown in FIG. 1.

As can also be seen, in particular in FIG. 2, the pipeline 20 has a predetermined cross-sectional constriction 23 between its end facing the copper plate 21 and the coolant area 9. This cross-sectional constriction is preferably provided in the lower half of the pipeline 20, facing the copper plate 21. The cross-sectional area F of this constriction 23 should in this case be chosen such that the heat flow W which is caused when the heating element 17 is activated and is represented by a line with arrows on it into the cryogenic medium M that is located in the coolant area 9 can at least be limited. This means that, when the heating element is activated, the dissipated power loss $U^2/R$ that this causes should be greater than the refrigeration power which is provided by the cryogenic medium located in the coolant area flowing through the constriction.

For known MRI magnet systems and thermal short-circuiting switches, the cross-sectional constriction 23 has a diameter in the order of magnitude between about 0.8 and 11.2 mm, so that the cross-sectional area F is then between 0.5 mm$^2$ and 100 m$^2$. The area F is preferably chosen to be between about 7 mm$^2$ and 30 mm$^2$, with the diameter preferably being chosen to be between about 2 mm and 10 mm. This makes it possible to keep the switch 15 in the normally conductive state, with a dissipated power in the order of magnitude of only 0.1 W up to a few tenths of a watt when its heating element 17 is activated, and/or as a result of the thermal power (U2/Rnormally conductive) that occurs along the switching path. This cross-sectional constriction makes it possible to limit the required refrigeration power from the coolant line system 8 and thus from the refrigeration installation 10 (so-called entrainment limit). The value of the cross-sectional area F which should specifically be chosen on the basis of these aspects can be determined in simple experiments.

The exemplary embodiment assumed above was based on the assumption that the superconductors of the superconducting device 2 together with their magnets 7a to 7d have to be cooled by a coolant line system 8 in which, when required, the cryogenic medium circulates on the basis of the thermosyphon effect. Other types of cooling are, of course, also suitable in order to keep the conductors below the critical temperature of their superconducting material. For example, bath cooling can also be provided for this purpose.

The cryosystem designed according to the invention for a superconducting device can, of course, also be used for superconducting appliances whose conductors also allow cooling at higher temperatures than those of LHe. These may, in particular, be conductors with so-called high-$T_c$ superconductor material, whose critical temperature is above 77° K, the boiling point of $LN_2$. An appropriate material must then be chosen for the superconducting switching path of the switch. However, it is also feasible to use a different superconducting material with a different critical temperature for this purpose.

Furthermore, it has been assumed that the at least one superconducting appliance is a magnet for an MRI installation. It may also, of course, be the magnet for a beam guidance system or for an energy storage installation. Since the superconducting switch need not necessarily be a short-circuiting switch for a corresponding magnet, the superconducting appliance may also be the winding of a transformer or of an electrical machine, or may be a section of a cable.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

What is claimed is:

1. A superconducting device, comprising:
   at least one superconducting appliance with superconductors;
   a superconducting switch, including
   a superconducting switching path, formed of superconducting material, electrically connected to the superconductors, and
   heating means, associated with the superconducting switching path, for controlled changing of the superconducting material of the switching path to a normally conductive state; and
   a cryosystem with a cryogenic medium, including
   at least one refrigeration installation cooling the cryogenic medium and having a refrigeration power,
   a coolant area collecting the cryogenic medium cooling the superconductors of said at least one superconducting appliance, and
   a pipeline having an open first end connected to the coolant area of the cryogenic medium to access a part of the cooling medium and a closed second end thermally coupled to the superconducting switching path of said superconducting switch, having a constriction with a cross-sectional area such that the refrigeration power transferred by the cryogenic medium located in the coolant area through the cross-sectional constriction is less than the dissipated thermal losses caused on activation of the heating means.

2. The device as claimed in claim 1, wherein the cross-sectional area of the constriction is between 0.5 $mm^2$ and 100 $mm^2$.

3. The device as claimed in claim 2, wherein the cross-sectional area of the constriction is between 7 $mm^2$ and 30 $mm^2$.

4. The device as claimed in claim 1, wherein the constriction is located in a part of the pipeline facing said superconducting switch.

5. The device as claimed in claim 1, wherein said cryosystem further includes a coolant line system having coolant paths on or through said at least one superconducting appliance, the collection area being part of the coolant line system.

6. The device as claimed in claim 5, wherein the cryogenic medium in the coolant line system circulates based on the thermosyphon effect.

7. The device as claimed in claim 6, wherein said at least one refrigeration installation includes a cold head located in the coolant line system and introducing the refrigeration power into the cryogenic medium.

8. The device as claimed in claim 1, further comprising a common vacuum area substantially surrounding said at least one superconducting appliance and said superconducting switch.

9. The device as claimed in claim 8, wherein the cryogenic medium in the pipeline circulates based on the thermosyphon effect.

10. The device as claimed in claim 9, wherein the cryogenic medium is helium.

11. The device as claimed in claim 1, wherein said superconducting switch is a continuous-current switch.

12. The device as claimed in claim 1, wherein said at least one superconducting appliance is a magnetic resonance imaging magnet.

13. The device as claimed in claim 1, wherein the superconductors of said at least one superconducting appliance are formed of metallic low-$T_c$ superconductor material.

14. The device as claimed in claim 1, wherein the superconductors of said at least one superconducting appliance are formed of oxidic high-$T_c$ superconductor material.

15. A superconducting device, comprising:
    at least one superconducting appliance with superconductors;
    a superconducting switch, including
    a superconducting switching path, formed of superconducting material, electrically connected to the superconductors, and
    heating means, associated with the superconducting switching path, for controlled changing of the superconducting material of the switching path to a normally conductive state; and
    a cryosystem with a cryogenic medium, including
    at least one refrigeration installation cooling the cryogenic medium and having a refrigeration power,
    a coolant area collecting the cryogenic medium cooling the superconductors of said at least one superconducting appliance, and
    a pipeline having an open first end connected to the coolant area of the cryogenic medium to access a part of the cooling medium and a closed second end thermally coupled to the superconducting switching path of said superconducting switch, having a cross-sectional constriction, the square dimension of the cross-sectional constriction is provided so that the dissipated thermal losses caused on activation of the heating means are greater than the refrigeration power transferred by the cryogenic medium located in the coolant area through the cross-sectional constriction.

16. A superconducting device, comprising:
at least one superconducting appliance with superconductors;
a superconducting switch, including
a superconducting switching path, formed of superconducting material, electrically connected to the superconductors, and
heating means, associated with the superconducting switching path, for controlled changing of the superconducting material of the switching path to a normally conductive state; and
a cryosystem with a cryogenic medium, including
at least one refrigeration installation cooling the cryogenic medium and having a refrigeration power,
a coolant area collecting the cryogenic medium cooling the superconductors of said at least one superconducting appliance, and
a pipeline having an open first end connected to the coolant area of the cryogenic medium to access a part of the cooling medium and a closed second end thermally coupled to the superconducting switching path of said superconducting switch, having a constriction with a cross-sectional area limiting the refrigeration power transferred by the cryogenic medium located in the coolant area through the cross-sectional constriction to an amount less than the dissipated thermal losses caused on activation of the heating means.

17. A superconducting device, comprising:
at least one superconducting appliance with superconductors;
a superconducting switch, connected to the superconductors, to switch between a superconducting and normally conductive state;
a cryosystem with a cryogenic medium to cool the superconductors; and
a pipeline having an open first end connected to the cryosystem and a closed second end thermally coupled to the superconducting switch;
wherein the pipeline includes a constricted area that reduces refrigeration power from the cryosystem required in response to heat dissipation from the superconducting switch.

* * * * *